(12) United States Patent
Choi et al.

(10) Patent No.: US 10,608,054 B2
(45) Date of Patent: Mar. 31, 2020

(54) ORGANIC LIGHT-EMITTING DIODE (OLED) DISPLAY AND METHOD OF MANUFACTURING THE SAME

(71) Applicant: SAMSUNG DISPLAY CO., LTD., Yongin-si, Gyeonggi-do (KR)

(72) Inventors: Haeyun Choi, Yongin-si (KR); Jaeik Lim, Yongin-si (KR); Jinwoo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/455,412

(22) Filed: Jun. 27, 2019

(65) Prior Publication Data

US 2019/0319074 A1    Oct. 17, 2019

Related U.S. Application Data

(63) Continuation of application No. 16/116,844, filed on Aug. 29, 2018, now Pat. No. 10,361,253, which is a (Continued)

(30) Foreign Application Priority Data

Aug. 5, 2014    (KR) .......................... 10-2014-0100705

(51) Int. Cl.
  *H01L 27/32*    (2006.01)
  *H01L 51/52*    (2006.01)
  *H01L 51/00*    (2006.01)

(52) U.S. Cl.
  CPC ........ *H01L 27/322* (2013.01); *H01L 27/3211* (2013.01); *H01L 51/0096* (2013.01);
  (Continued)

(58) Field of Classification Search
  CPC ............... H01L 27/322; H01L 51/5253; H01L 51/0096; H01L 27/3211; H01L 51/5284; H01L 51/5275; H01L 51/5256
  See application file for complete search history.

(56) References Cited

U.S. PATENT DOCUMENTS

2004/0262615 A1    12/2004    Cok
2005/0127822 A1    6/2005    Takeuchi et al.
(Continued)

FOREIGN PATENT DOCUMENTS

JP    2000-199803 A    7/2000
JP    2004-021209 A    1/2004
(Continued)

*Primary Examiner* — John P. Dulka
(74) *Attorney, Agent, or Firm* — Lewis Roca Rothgerber Christie LLP

(57) ABSTRACT

An organic light-emitting diode (OLED) display is disclosed. In one aspect, the OLED display includes a substrate, a plurality of sub-pixels over the substrate, wherein each of the plurality of sub-pixels includes an OLED layer comprising an OLED, wherein the OLED comprises a first electrode, a second electrode facing the first electrode, and an emitting layer therebetween, an encapsulation layer over the OLED layer and comprising at least one inorganic layer and at least one organic layer, a refractive layer comprising a first refractive index layer that is located over the encapsulation layer and has a recess and a second refractive index layer that is located over the first refractive index layer, wherein the second refractive index is greater than the first refractive index, and wherein an upper surface of the refractive layer is flat.

15 Claims, 3 Drawing Sheets

Related U.S. Application Data continuation of application No. 15/219,076, filed on Jul. 25, 2016, now Pat. No. 10,084,024, which is a continuation of application No. 14/639,808, filed on Mar. 5, 2015, now Pat. No. 9,406,724.

(52) U.S. Cl.
CPC ...... *H01L 51/5253* (2013.01); *H01L 51/5275* (2013.01); *H01L 51/5284* (2013.01); *H01L 51/5256* (2013.01)

(56) References Cited

U.S. PATENT DOCUMENTS

| | | |
|---|---|---|
| 2006/0062270 A1 | 3/2006 | Okutani et al. |
| 2007/0115422 A1 | 5/2007 | Lee et al. |
| 2007/0153160 A1 | 7/2007 | Lee et al. |
| 2007/0200492 A1 | 8/2007 | Cok et al. |
| 2008/0309224 A1 | 12/2008 | Kwak et al. |
| 2009/0073691 A1 | 3/2009 | Shibasaki et al. |
| 2011/0062476 A1 | 3/2011 | Tobise |
| 2011/0180835 A1* | 7/2011 | Ono .................. H01L 51/5212 257/98 |
| 2011/0279760 A1 | 11/2011 | Yang et al. |
| 2012/0218173 A1 | 8/2012 | Ohta et al. |
| 2012/0250303 A1 | 10/2012 | Asaki et al. |
| 2014/0027724 A1 | 1/2014 | Lim et al. |
| 2014/0027725 A1 | 1/2014 | Lim et al. |
| 2015/0076468 A1* | 3/2015 | Yamaguchi ............ G02B 1/118 257/40 |
| 2015/0084026 A1 | 3/2015 | Miyamoto et al. |
| 2015/0349212 A1 | 12/2015 | Cunningham et al. |
| 2015/0380466 A1 | 12/2015 | Koo et al. |
| 2016/0020431 A1 | 1/2016 | Yamae et al. |
| 2016/0079311 A1* | 3/2016 | Lim .................. H01L 27/322 257/40 |
| 2017/0012244 A1 | 1/2017 | Matsuzaki |
| 2017/0207421 A1 | 7/2017 | Matsuzaki et al. |
| 2017/0317148 A1 | 11/2017 | Uchida et al. |

FOREIGN PATENT DOCUMENTS

| | | |
|---|---|---|
| KR | 10-1994-0022138 A | 10/1994 |
| KR | 10-2004-0110178 A | 12/2004 |
| KR | 10-2007-0049007 A | 5/2007 |
| KR | 10-2007-0071293 A | 7/2007 |
| KR | 10-2014-0014684 A | 2/2014 |
| KR | 10-2014-0014685 A | 2/2014 |

* cited by examiner

ORGANIC LIGHT-EMITTING DIODE (OLED) DISPLAY AND METHOD OF MANUFACTURING THE SAME

CROSS-REFERENCE TO RELATED APPLICATIONS

This application is a continuation of U.S. patent application Ser. No. 16/116,844, filed Aug. 29, 2018, which is a continuation of U.S. patent application Ser. No. 15/219,076, filed Jul. 25, 2016, now U.S. Pat. No. 10,084,024, which is a continuation of U.S. patent application Ser. No. 14/639,808 filed on Mar. 5, 2015, now U.S. Pat. No. 9,406,724, which claims priority to and the benefit of Korean Patent Application No. 10-2014-0100705, filed Aug. 5, 2014, the entire content of all of which is incorporated herein by reference.

BACKGROUND

Field

The described technology generally relates to an organic light-emitting diode (OLED) display and a method of manufacturing the same.

Description of the Related Technology

Since an OLED display is self-emissive, it can operate at a low voltage and can be lightweight and thin. In addition, OLED technology has drawn attention as a next generation display because of its favorable characteristics such as wide viewing angles, a high contrast and fast response speed. The OLED display implements full colors by using three colors of light, for example, red, green and blue. To implement high-quality colors regardless of viewing angles of a user, an OLED display which has good light efficiency and wide side viewing angles needs to be implemented.

SUMMARY OF CERTAIN INVENTIVE ASPECTS

One inventive aspect is an OLED display and a method of manufacturing the same.

Another aspect is an OLED display which includes: an organic light-emitting device including a plurality of pixels which emit different colors of light; an encapsulation layer formed on the organic light-emitting device; a color filter layer formed on an upper surface of the encapsulation layer and including color filters which are formed on areas corresponding to the plurality of pixels and light block units which are respectively formed between the color filters; and an edge lens unit formed on a lower surface of the color filter layer and formed between a lower surface of each of the color filter and a lower surface of each of the light block unit.

The edge lens unit may include at least one edge lens which is convex in a direction opposite to a light emission direction.

A bonding area where the encapsulation layer and the color filter layer may be bonded to each other is filled with air.

The edge lens unit may be formed of an organic material having a refractive index that is higher than a refractive index of air.

The bonding area where the encapsulation layer and the color filter layer are bonded to each other may be filled with an organic material having a low refractive index.

The edge lens unit may be filled with an organic material having a refractive index that is higher than the refractive index of the organic material filling the bonding area.

The edge lens may be formed on edges of the light block unit and some of the color filters.

The at least one edge lens may have a polygonal shape having two or more facets according to a shape of each of the pixels.

The height of the at least one edge lens may be in a range from about 1 to about 5 micrometers.

The width of the at least one edge lens may be between 2 micrometers and half of the width of one of the color filters.

An initial angle of the at least one edge lens may be in a range from about 40 to about 90 degrees.

Another aspect is an OLED display which includes: an organic light-emitting device including a plurality of pixels which emit different colors of light; an encapsulation layer formed on the organic light-emitting device; a color filter layer including color filters formed on areas corresponding to pixels and light block units respectively formed between the color filters; and edge lens units formed on a lower surface of the color filter layer and formed between lower surfaces of the color filters and those of the light block units.

The light diffusion lens unit may include at least one light diffusion lens which is formed on each of the color filters and is convex in a light emission direction.

The edge lens unit and the light diffusion lens unit may be formed of an organic material having a small refractive index.

The height of the at least one light diffusion lens may be equal to or greater than 1 micrometer.

The width of the at least one light diffusion lens may be between 2 micrometers and a third of the width of one of the color filters.

The light diffusion lens unit may be formed on each of the color filters and include two or more light diffusion lenses which are formed in each of the color filters and convex in a light emission direction.

Another aspect is a method of manufacturing an OLED display, which includes: forming, on a substrate, organic light-emitting devices which comprise a plurality of sub-pixels emitting different colors of light; forming an encapsulation layer which encapsulates the organic light-emitting devices; forming a color filter layer comprising color filters which are formed on areas corresponding to the plurality of sub-pixels and light block units which are respectively formed between the color filters; forming edge lens units on a lower surface of the color filter layer and between lower surfaces of the color filters and lower surfaces of the light block unit; and bonding the color filter layer, which has the lower surface on which the edge lens units are formed, to the organic light-emitting devices which are formed on the substrate and encapsulated by an encapsulation layer.

In the bonding, a bonding area where the color filter layer is bonded to the encapsulation layer may be in an air state.

In the bonding, a bonding area where the color filter layer is bonded to the encapsulation layer may be filled with an organic material having a low refractive index. In the bonding, the color filter layer may be bonded to the encapsulation layer in the bonding area by at least one of an on drop filling (ODF) process and an encapsulation process.

Another aspect is an organic light-emitting diode (OLED) display comprising: an OLED comprising a plurality of pixels configured to emit different colors of light; an encapsulation layer formed over the OLED; a color filter layer formed over the encapsulation layer, wherein the color filter layer comprises a plurality of color filters formed on regions corresponding to the pixels and a plurality of light block units respectively formed at least between the color filters; and an edge lens unit formed at least between a lower surface of each of the color filters and a lower surface of each of the light block units.

In the above display, the edge lens unit comprises at least one edge lens convex toward the encapsulation layer. In the above display, a bonding area where the encapsulation layer and the color filter layer are bonded to each other is substantially filled with air. In the above display, the edge lens unit is formed of an organic material having a refractive index higher than the refractive index of air. In the above display, the bonding area is substantially filled with an organic material having a low refractive index. In the above display, the edge lens unit is substantially filled with an organic material having a refractive index higher than the refractive index of the organic material filling the bonding area. In the above display, the at least one edge lens is formed on an edge portion of a black matrix and color filters adjacent to the edge portion of the black matrix from among the color filters.

In the above display, the at least one edge lens has a polygonal shape having a plurality of facets according to a shape of each of the pixels. In the above display, the height of the at least one edge lens is in a range from about 1 micrometers to about 5 micrometers. In the above display, the width of the at least one edge lens is between about 2 micrometers and half of the width of one of the color filters. In the above display, an initial angle of the at least one edge lens is in a range from about 40 degrees to about 90 degrees, and wherein the initial angle is measured with respect to a lower surface of the color filter layer. The above display further comprises a light diffusion lens unit formed over the color filter layer. In the above display, the light diffusion lens unit comprises at least one light diffusion lens formed over each of the color filters and shaped to be convex toward the encapsulation layer.

In the above display, the edge lens unit and the light diffusion lens unit are formed of an organic material. In the above display, the height of the at least one light diffusion lens is greater than or equal to about 1 micrometer. In the above display, the width of the at least one light diffusion lens is between about 2 micrometers and about a third of the width of one of the color filters. In the above display, the light diffusion lens unit is formed on each of the color filters and comprises a plurality of light diffusion lenses formed in each of the color filters and convex toward the encapsulation layer.

Another aspect is a method of manufacturing an organic light-emitting diode (OLED) display, the method comprising: forming, over a substrate, an OLED comprising a plurality of pixels configured to emit different colors of light; forming an encapsulation layer which encapsulates the OLEDs; forming a color filter layer comprising a plurality of color filters formed on regions corresponding to the pixels and a plurality of light block units respectively formed at least between the color filters; forming an edge lens unit at least between lower surfaces of the color filters and lower surfaces of the light block units; and bonding the color filter layer to the OLED.

In the above method, a bonding area where the color filter layer is bonded to the encapsulation layer is in an air state. In the above method, a bonding area where the color filter layer is bonded to the encapsulation layer is substantially filled with an organic material having a low refractive index. In the above method, the color filter layer is bonded to the encapsulation layer in the bonding area by at least one of an on drop filling (ODF) process and an encapsulation process.

DETAILED DESCRIPTION OF CERTAIN INVENTIVE EMBODIMENTS

Figure 1:
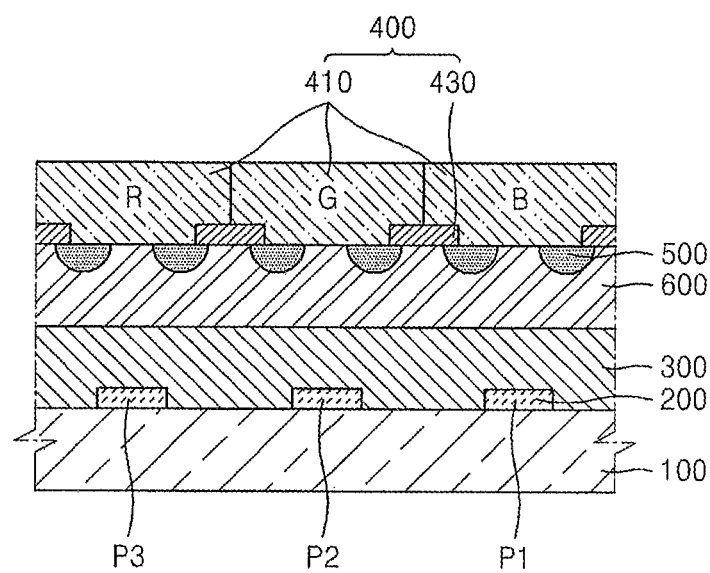
FIG. 1 is a schematic cross-sectional view of an OLED display according to an embodiment.

While such terms as "first", "second", etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Hereinafter, embodiments will be described in detail with reference to the attached drawings. Like reference numerals in the drawings denote like elements.

Figure 2:
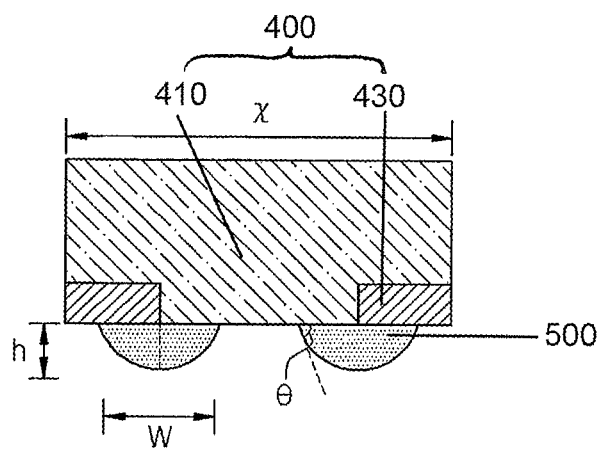
FIG. 2 is a diagram of an enlarged portion of the OLED display of FIG. 1.
Figure 3:
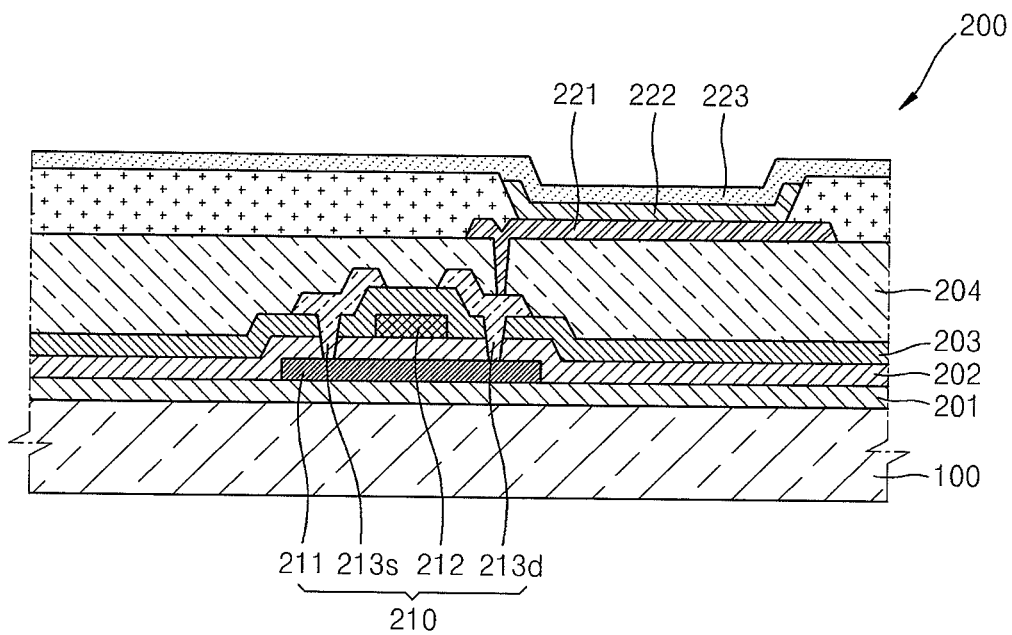
FIG. 3 is a diagram of an organic light-emitting device of FIG. 1 which corresponds to one sub-pixel area.

FIG. 1 is a schematic cross-sectional view of an OLED display according to an embodiment, and FIG. 2 is a diagram of an enlarged portion of the OLED display of FIG. 1. FIG. 3 is a diagram of an organic light-emitting device or OLED 200 of FIG. 1 which corresponds to one sub-pixel area.

Referring to FIG. 1, the OLED display includes a substrate 100, organic light-emitting devices 200 formed on the substrate 100, an encapsulation layer 300, a color filter layer 400, and edge lens units 500.

The substrate 100 may be formed of plastic having a good heat resistance and durability. However, the substrate 100 may be formed of various materials such as metals and glass.

The organic light-emitting device 200 is formed on the substrate 100 and may include sub-pixels P1, P2 and P3 emitting different colors of light. As an exemplary embodiment, a display device 200 may be an organic light-emitting device including a first sub-pixel P1 which emits blue light, a second sub-pixel P2 which emits green light, and a third sub-pixel P3 which emits red light.

Referring to FIG. 3, the organic light-emitting device 200 may include a buffer layer 201 which is formed on the substrate 100 and substantially blocks impurities and moisture, a thin film transistor (TFT) 210 formed on the buffer layer 201, a first electrode 221 which is connected to the TFT 210, a second electrode 223 which is opposite to the first electrode 221, an intermediate layer 222 which is interposed between the first and second electrodes 221 and 223 and includes an emission layer.

The TFT 210 may include an active layer 211, a gate electrode 212, source electrode 213s, and a drain electrode 213d. A first insulating layer 202 may be interposed between the gate electrode 212 and the active layer 211 as a gate insulating layer in order to insulate the gate electrode 212 and the active layer 211 from each other. The active layer 211 may include a channel area formed at the center thereof and source and drain areas formed on both sides of the channel area. The active layer 211 may include amorphous silicon, crystalline silicon, or an oxide semiconductor.

The source and drain areas may be formed when the gate electrode 212 is doped with highly concentrated impurities by using a self-align mask. In FIG. 3, a top-gate type TFT 210 is illustrated, but is not limited thereto. As another example, a bottom-gate type TFT may be used.

The source and drain electrodes 213s and 213d are formed on the gate electrode 212 by interposing a second insulating layer 203 between the source and drain electrodes 213s and 213d. The source and drain electrodes 213s and 213d may be electrically connected to the source and drain areas, respectively. A third insulating layer 204 may be formed on the source and drain electrodes 213s and 213d.

Any one of the source and drain electrodes 213s and 213d may be electrically connected to the first electrode 221, and the intermediate layer 222 including the emission layer, and the second electrode 223 may be formed on the first electrode 221.

As shown in FIG. 3, each of the sub-pixels P1, P2 and P3 has the above-described structure, and the emission layer included in the intermediate layer 222 of each of the sub-pixels P1, P2 and P3 includes organic materials which emit red, green, and blue light. The emission layer emitting red, green, and blue light may include a low molecular weight organic material or a polymer organic material. According to types of the organic light-emitting layer, the intermediate layer 222 may further include at least one of a hole transport layer, a hole injection layer, an electron transport layer, and an electron injection layer.

Referring back to FIG. 1, the encapsulation layer 300 is formed on the organic light-emitting device 200 and protects the organic light-emitting device 200 from impurities and/or external air. The encapsulation layer 300 may be formed right above the organic light-emitting device 200 and may be a thin-film encapsulation layer in which an organic layer and an inorganic layer are alternately stacked. The organic layer may include an acryl-based resin, an epoxy-based resin, and a polymer-based resin such as polyimide and polyethylene, and the inorganic layer may include metal oxide, metal nitride, metal carbide, and a combination thereof.

The color filter layer 400 is formed on the encapsulation layer 300 and may include color filters 410 formed on areas corresponding to the sub-pixels P1, P2 and P3 and light block units 430 respectively formed between the color filters 410 (or formed on areas corresponding to areas between the sub-pixels P1, P2 and P3). Since an extremely small amount of external light that is incident onto the colors filters 410 is reflected, external light visibility and definition of an image may be improved. The light block units 430 formed on the areas between the sub-pixels P1, P2 and P3, that is, non-emissive areas, are used to reduce contrast resulting from bottom reflection of the external light and may include a black matrix which absorbs light of a wavelength of visible spectrum. The bottom reflection means that light is reflected from electrodes or wiring layers of the organic light-emitting device 200 or the substrate 100 formed under the organic light-emitting device 200.

The OLED display according to the present embodiment may further include edge lens units 500 formed under the color filter layer 400, as shown in FIG. 1.

Each of the edge lens units 500 may include one or more edge lenses, and in particular, the edge lenses may be respectively formed on a lower surface of the color filter layer 400 and may be respectively formed between lower surfaces of the light block units 430 adjacent to the color filters 410. Each of the edge lenses may be formed of an organic material having a high refractive index.

As shown in FIG. 1, each edge lens may protrude on a lower surface of the color filter layer 400 in a direction opposite to a light emission direction. That is, each of the edge lenses may protrude toward the substrate 100.

Also, there may be one or more edge lenses, and the edge lenses may be respectively formed between the lower surfaces of the light block units 430 adjacent to the color filters 410, as shown in FIG. 1. That is, each lens unit 500 may be formed to include six edge lenses in one sub-pixel. However, the number of edge lenses is not limited thereto.

That is, each of the edge lens units 500 has a convex shape and is formed on the lower surface of the color filter layer 400. Thus, the edge lens units 500 may be respectively formed between the lower surfaces of the color filters 410 and the lower surfaces of the light block units 430 adjacent to the color filters 410. As a result, overall efficiency of the organic light-emitting devices 200 is improved, and a problem regarding viewing angles may be corrected due to the edge lens units 500. A form, materials, and functions of the edge lens units 500 will be described in detail later.

The OLED display according to the present embodiment has an advantage in that the edge lens units 500 are respectively formed between the lower surfaces of the light block units 430 adjacent to the color filters 410, thereby effectively emitting light.

That is, light emitted from the organic light-emitting devices 200 passes edge lenses formed on the lower surface of the color filter layer 400 and may pass toward the viewing angles of a user because the edge lenses are formed between the lower surfaces of the color filters 410 and those of the light block units 430. In the case of light which is substantially straightly emitted toward a center, although the efficiency of the light may be low, the efficiency of the organic light-emitting devices may be generally improved, and the viewing angles may also be improved.

As shown in FIG. 1, a bonding layer 600, which is formed between the color filter layer 400 under which the edge lens units 500 are formed and the substrate 100 on which the organic light-emitting devices 200 are formed, may be formed by being substantially filled with a material having a low refractive index.

When the boding unit 600 is formed of the material having the low refractive index, refractive indices of the edge lens units 500 and the bonding area 600 are increased, and thus, reflection of external light is decreased.

That is, when light is from the outside, external light penetrates sub-pixel areas and then is reflected from the same. In this case, if the light is curved toward the light block units 430 by using a difference between the refractive indices, the light is absorbed by the light block units 430, and thus, reflection of the external light may be decreased.

In the OLED display according to the present embodiment, an area between the encapsulation layer 300 and the color filter layer 400 may be substantially filled with air. That is, when a substrate layer, on which an upper surface of the color filter layer 400 and a lower surface of the encapsulation layer 300 are formed, is bonded in a vacuum state, the bonding area 600 may be in an air state.

A refractive index of the air is 1.0, and the edge lens units 500 may be formed of a material having a refractive index higher than the refractive index of the air. Accordingly, when external light is from the outside, since the edge lenses are convex and a refractive index of the edge lenses are higher than those of neighboring components, the light may be refracted outward.

The bonding area 600 which bonds the area between the color filter layer 400 and the encapsulation layer 300 may be substantially filled with a material having a low refractive index.

In this embodiment, since the bonding area 600 is substantially filled with the material having the low refractive index, the edge lenses may have the refractive index higher than the refractive index of the organic material which fills the bonding area 600.

Furthermore, since the refractive index of the edge lenses is higher than that of the organic material which is formed on a lower portion, light emitted from the organic light-emitting device 200 may be effectively extracted.

Therefore, as the edge lenses having the high refractive index are formed between the lower surfaces of the color filters 410 and those of the light block units 430 and bottom portions of the edge lenses are substantially filled with an organic material having a low refractive index or air, light efficiency is improved. In addition, since the user may watch an entire screen even when the user watches the screen at a side, the viewing angles are improved.

FIG. 2 shows one color filter 410 corresponding to a pixel, the light block unit 430 corresponding to the color filter 410, and one edge lens unit 500 in detail.

As shown in FIGS. 1 and 2, the edge lenses may be formed on edges of the light block units 430.

In some embodiments, the edge lenses are not separately formed in each color filter area, and some of the edge lenses may be formed on the light block units 430 and the other of the edge lenses are formed on the color filters 410.

As the edge lenses are formed on the lower surfaces of the color filters 410 and those of the light block units 430 adjacent to the color filters 410, the number of edge lenses formed on the lower surfaces of the color filters 410 and those of the light block units 430 adjacent to the color filters 410 may be greater than the number of edge lenses formed only on the lower surfaces of the color filters 410.

In some embodiments, when the edge lenses are formed only on the lower surfaces of the color filters 410, the edge lens may be respectively formed on the lower surfaces of the color filters 410. When some of the edge lenses are formed on the edges of the light block units 430 and the other of the edge lenses are formed on the lower surfaces of the color filters 410, two edge lenses may be formed on each of the lower surfaces of color filter 410 as shown in FIG. 2.

Therefore, the maximum number of edge lenses that may be included in the edge lens unit 500 is increased, and accordingly, refraction of light may be great when external light enters. That is, the efficiency of the OLED display is improved, and side visibility may be improved.

According to shapes of the color filters 410, the edge lenses may have a polygonal shape having two or more facets.

Each of the color filters 410 may have a square, diamond, rectangular or polygonal shape. The color filters 410 and the light block units 430 may have a gap or tolerance of about 2 micrometers in order not to pass areas of the color filters 410.

Accordingly, the edge lenses are not limited within the areas which do not pass the color filters 410 and may have a square, diamond, rectangular or polygonal shape.

When the edge lenses are formed, shapes thereof are not limited thereto. However, since the edge lenses are formed on the lower surface of the color filter layer 400, the shape of the color filter layer 400 may be affected. That is, the edge lenses have a polygonal shape having two or more facets, and the edge lens units 500 may be formed due to an influence of the color filter layers 400.

Hereinafter, the shape of the edge lens of FIG. 2 will be described in detail.

The heights h of the edge lenses may be from about 1 to about 5 micrometers.

The edge lenses are formed on the lower surface of the color filter layer 400, and the heights h of the edge lenses may not contact the encapsulation layer 300 because the color filter layer 400 and the encapsulation layer 300 are bonded by the bonding area 600.

Thus, if the heights h of the edge lenses are from about 1 to about 5 micrometers, the efficiency may be maximized, but the heights h of the edge lenses are not limited thereto.

The widths W of the edge lenses may be between 2 micrometers and half of widths x of the color filters 410.

Since the edge lenses are formed on the edges of the light block units 430 and the color filters 410, the edge lenses may be formed on edges of two light block units 430 adjacent to one color filter 410 as described above. Accordingly, the widths W of the edge lenses may be limited.

As shown in FIG. 2, when two edge lenses are formed on each of the lower surfaces of the color filters 410, the sum of the widths 2 of the edge lenses may be equal to or smaller than the widths x of the color filters 410.

Therefore, the widths w of the edge lenses may be a half of maximum widths x of the color filters 410. For example, if the widths w of the edge lenses are greater than or equal to about 4 micrometers and less than or equal to about 18 micrometers, the efficiency of the OLED display may be maximized.

However, the widths w of the edge lenses are not limited thereto, and if the widths w of the edge lenses may be between about 2 micrometers and half of the widths x of the color filters 410, the widths w of the edge lenses are not limited to a certain number.

Initial angle θ of the edge lenses may be in a range from about 40 degrees to about 90 degrees. The initial angle θ of the edge lenses may be determined according to the heights h and widths w of the edge lenses, but are not limited thereto. The initial angle θ of the edge lenses may be determined to maximize the efficiency of the OLED display.

The OLED display according to the present embodiment may maximize the light efficiency by adjusting the initial angle θ, heights h and widths of the edge lenses within a range capable of forming the edge lenses.

Figure 4:
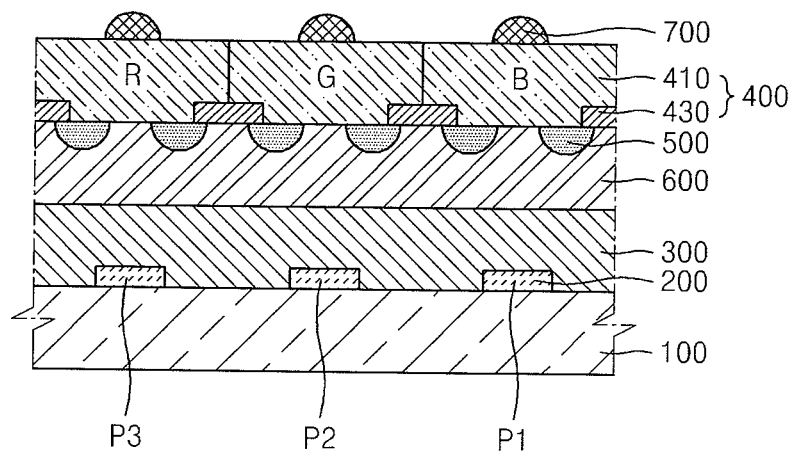
FIG. 4 is a schematic diagram of an OLED display according to another embodiment.
Figure 5:
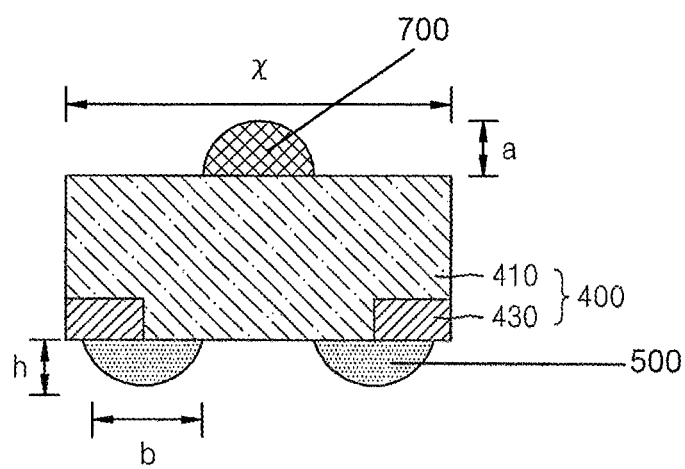
FIG. 5 is a diagram of an enlarged portion of the OLED display of FIG. 4.

FIG. 4 is a schematic diagram of an OLED display according to another embodiment of the present invention, and FIG. 5 is a diagram of an enlarged portion of the OLED display of FIG. 4.

As shown in FIG. 4, the OLED display may further include light diffusion lens units 700 formed above the color filter layer 400.

Each of the light diffusion lens units 700 may include a light diffusion lens which diffuses light generated and emitted by the organic light-emitting devices 200 and may be convex in a light emission direction.

The light diffusion lens unit 700 may include at least one light diffusion lens, and the at least one light diffusion lens may be formed on each of the color filters 410.

In some embodiments, the light diffusion lens units 700 are formed only in the color filters 410 unlike the edge lens units 500 which are not formed only on the lower surfaces of the color filters 410 but formed between the lower surfaces of the color filters 410 and those of the light block units 430 adjacent to the color filters 410.

The light diffusion lens units 700 are respectively formed in the color filters 410, and as shown in FIG. 4, three light diffusion lenses may be included in one sub-pixel, but the present invention is not limited thereto.

Since the OLED display according to the present embodiment may include the edge lens units 500 on the lower surface of the color filter layer 400 and the light diffusion lens units 700 on the upper surface of the color filter layer 400, the light efficiency may be more improved.

External light can be refracted and reflected in the OLED display by the edge lens unit 500, and the reflected light can be absorbed by the light block units 430. Thus, the reflection may be reduced and light emitted from the organic light-emitting device 200 to the outside may be diffused and emitted by the light diffusion lens unit 700.

Therefore, the light efficiency of the OLED display may be improved more by preparing both the edge lens units 500 and the light diffusion lens unit 700. The emitted light is diffused, and thus, degradation of visibility at sides may be corrected. That is, side visibility (WAD) may be improved.

The edge lenses included in the edge lens units 500 and the light diffusion lenses included in the light diffusion lens units 700 may be formed of organic materials having a high refractive index.

As described above, the edge lenses are formed of the organic materials having the refractive index higher than the refractive index of an organic material which fills the bonding area 600, and thus, external light may be effectively refracted and reflected in the OLED display.

Also, the light diffusion lenses may be formed of the organic materials having the high refractive index in order to make light be effectively diffused to the upper surface of the color filter layer 400 due to refraction of the light.

FIG. 5 is a diagram of an enlarged portion of the OLED display according to another embodiment. FIG. 5 shows one light block unit 430 adjacent to one of the color filters 410 and a lens unit formed on an upper surface and a lower surface of the color filter layer 400.

The light diffusion lens formed on the upper surface of the color filter layer 400 may have a height "a" of at least about 1 micrometer. Since the light diffusion lens is formed to allow light emitted from the OLED display to be refracted and diffused, and light diffusion lens may have a height "a" of at least about 1 micrometer.

The height a of the light diffusion lens may not be limited unlike the edge lenses formed on the lower surface of the color filter layer 400. Since the light diffusion lens is formed on the upper surface of the color filter layer 400, the light diffusion lens may not contact other components such as the encapsulation layer 300 unlike the edge lens.

As shown in FIG. 5, the width b of each of the edge lens formed on the OLED display may be between about 2 micrometers and about a third of the width x of a color filter.

As shown in FIG. 5, widths of the edge lenses formed on the lower surface of the color filter layer 400 and those of the light diffusion lenses formed on the upper surface of the color filter layer 400 may not overlap.

That is, the edge lenses are formed on edges of the light block units 430 and some of the color filters 410, and the light diffusion lenses are formed in the color filters 410 in order not to overlap the edge lenses.

If the edge lens units 500 formed on the lower surface of the color filter layer 400 and the light diffusion lens units 700 formed on the upper surface thereof overlap, a path, via which light that is refracted passes, is disturbed and light efficiency may be decreased.

Therefore, as shown in FIG. 5, if two edge lenses are formed on the lower surface of the color filter layer 400 and one light diffusion lens is formed on the upper surface thereof in order not to make the widths of the edge lenses and light diffusion lens overlap on a color filter 410, the sum of the widths of three lenses, that is, two edge lenses and the light diffusion lens, may be the same as a width x of the color filter 410.

In this case, each lens may not overlap each other, and since the sum of the widths of three lenses is the same as the width x of the color filter 410, a width of each lens may be about a third of the width x of the color filter 410.

Therefore, the width b of each edge lens may be a half of the width x of the color filter 410 at most. In some embodiments, when the width b of each edge lens is in a range from about 4 micrometers to about 18 micrometers, the efficiency of the OLED display may be maximized.

However, the length of the width b of each edge lens is not limited thereto. If the length of the width b of each edge lens is between micrometers 2 micrometers and about a third of the width x of the color filter 410, the length of the width b may not be limited to a certain range.

Descriptions regarding shapes of lenses other than the above detailed descriptions are the same as descriptions regarding the OLED display according to the above embodiment of the present invention. That is, since descriptions regarding the height h and initial angle θ of the edge lens are already provided, descriptions will not be repeated for convenience of explanation.

Figure 6:
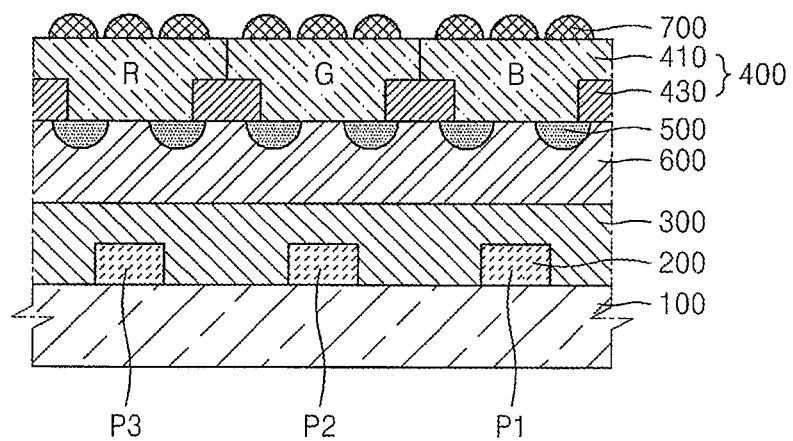
FIG. 6 is a schematic diagram of an OLED display according to another embodiment.

FIG. 6 is a schematic diagram of an OLED display according to another embodiment.

In the OLED display according to the present embodiment, the light diffusion lens unit 700 formed on the upper surface of the color filter layer 400 may include at least two light diffusion lenses in each color filter 410.

As shown in FIG. 6, three light diffusion lenses may be formed on an upper portion of each color filter 410.

That is, the edge lens unit 500 may be formed on the lower surface of the color filter layer 400, and the light diffusion lens unit 700 may be formed on the upper surface of the color filter layer 400. The light diffusion lens unit 700 may have nine light diffusion lenses in each sub-pixel.

The number of light diffusion lenses is not limited to the above description, and nine or more light diffusion lenses may be included in one sub-pixel.

When multiple light diffusion lenses are included, the width of each light diffusion lens may be small, and as shown in FIG. 6, the widths of the light diffusion lenses and those of the edge lenses may overlap. However, the present embodiment is not limited thereto, and the widths of the light diffusion lenses and those of the edge lenses may not overlap. In this case, the length of the width of each light diffusion lens may be much small.

When multiple light diffusion lenses are formed as in the OLED display according to the present embodiment, light emitted from the organic light-emitting device 200 is rather effectively diffused, and thus a problem regarding the side visibility (WAD) may be corrected.

Each of the components of the OLED display shown in FIG. 6 has the same structure and effects as the components that are already described, and thus, descriptions regarding the components of the OLED display will not be repeated.

According to a method of manufacturing the OLED display according to the present embodiment, an organic light-emitting device 200 including a plurality of pixels emitting different colors of light may be formed on the substrate 100 as shown in FIG. 6.

When the organic light-emitting device 200 is formed on the substrate 100, an encapsulation layer 300 may be formed on an upper surface of the organic light-emitting device 200 in order to encapsulate the organic light-emitting device 200 to prevent the organic light-emitting device 200 from light and moisture.

Then, a color filter layer 400 formed on an upper surface of the encapsulation layer 300 may be formed. The color filter layer 400 may include color filters 410 formed on areas corresponding to pixels, and light block units 430 respectively formed between the lower surfaces of the color filters 410.

Edge lens units 500 which are formed on a lower surface of the color filter layer 400 and formed between the lower surfaces of the color filters and those of the light block units 430 may be formed.

A bonding process, via which the organic light-emitting device 200 which is encapsulated by the encapsulation layer 300 is bonded to the lower surface of the color filter layer 400 on which the edge lens units 500 are formed, may be performed.

According to the method of manufacturing the OLED display according to the present embodiment, a bonding area where the color filter layer 400 and the encapsulation layer 300 are bonded may be substantially filled with air in the bonding process.

Since air has a refractive index smaller than that of the edge lens units 500, external light may be refracted when the external light passes edge lenses and penetrates the air, and also, the refracted light may be absorbed by the light block units 430 due to the reflection, thereby decreasing reflection of the external light.

According to some embodiments, a bonding area where a color filter layer 400 and an encapsulation layer 300 are bonded may be substantially filled with an organic material having a low refractive index and then bonded.

In this case, edge lens units 500 may be formed of an organic material having a high refractive index. Since a bonding area 600 formed on lower portions of the edge lens units 500 are substantially filled with an organic material having a refractive index that is lower than a refractive index of the edge lenses, reflection and refraction of external light may occur when the external light enters, and thus, the reflection of the external light may be decreased.

As described above, according to at least one of the disclosed embodiments, an OLED display having improved brightness of an entire screen and side viewing angles can be provided.

It should be understood that the exemplary embodiments described therein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display comprising:
   a substrate;
   an OLED on the substrate, the OLED comprising a first electrode, a second electrode facing the first electrode, and an emitting layer therebetween;
   an encapsulation section over the OLED and comprising at least one inorganic layer and at least one organic layer; and
   a refractive section comprising:
      a first refractive index layer located over the encapsulation section; and
      a second refractive index layer located over the first refractive index layer and including a portion that protrudes toward the encapsulation section,
      wherein the first refractive index layer has a first refractive index, and the second refractive index layer has a second refractive index that is greater than the first refractive index, and
      wherein an upper surface of the refractive section is flat.

2. The OLED display of claim 1, wherein the second refractive index layer is in direct contact with the first refractive index layer.

3. The OLED display of claim 1, wherein the portion of the second refractive index layer overlaps a portion of the OLED.

4. The OLED display of claim 1, wherein an upper surface of the second refractive index layer is located on a same plane as the upper surface of the refractive section.

5. The OLED display of claim 1, wherein the first refractive index layer comprises an organic material.

6. The OLED display of claim 1, wherein the second refractive index layer comprises an organic material.

7. The OLED display of claim 1, wherein the portion of the second refractive index layer has an inclined surface that is inclined with respect to the upper surface of the refractive section.

8. The OLED display of claim 7, wherein an initial angle of the inclined surface is in a range from about 40 degrees to about 90 degrees.

9. An organic light-emitting diode (OLED) display comprising:
   an OLED comprising a first electrode, a second electrode facing the first electrode, and an emitting layer therebetween;
   an encapsulation section over the OLED and comprising at least one inorganic layer and at least one organic layer; and
   a refractive section comprising:
      a first refractive index layer located over the encapsulation section; and
      a second refractive index layer located over the first refractive index layer and including a portion that protrudes toward the encapsulation section and that overlaps a portion of the OLED,
      wherein the first refractive index layer has a first refractive index, and the second refractive index layer has a second refractive index that is greater than the first refractive index, and wherein the second refractive index layer is in direct contact with the first refractive index layer.

10. The OLED display of claim 9, wherein an upper surface of the second refractive index layer is located on a same plane as an upper surface of the refractive section.

11. The OLED display of claim 9, wherein an upper surface of the refractive section is flat.

12. The OLED display of claim 11, wherein the portion of the second refractive index layer has an inclined surface that is inclined with respect to the an upper surface of the refractive section.

13. The OLED display of claim 12, wherein an initial angle of the inclined surface is in a range from about 40 degrees to about 90 degrees.

14. The OLED display of claim 9, wherein the first refractive index layer comprises an organic material.

15. The OLED display of claim 9, wherein the second refractive index layer comprises an organic material.

* * * * *